United States Patent
Zha

(10) Patent No.: US 10,512,159 B2
(45) Date of Patent: Dec. 17, 2019

(54) DRIVING SUBSTRATE, MANUFACTURING PROCESS, AND MICRO-LED ARRAY LIGHT-EMITTING BACKLIGHT MODULE

(71) Applicant: Wuhan China Star Optoelectronics Technology Co., Ltd., Wuhan (CN)

(72) Inventor: Guowei Zha, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/300,045

(22) PCT Filed: Sep. 14, 2018

(86) PCT No.: PCT/CN2018/105613
§ 371 (c)(1),
(2) Date: Nov. 8, 2018

(87) PCT Pub. No.: WO2019/205438
PCT Pub. Date: Oct. 31, 2019

(65) Prior Publication Data
US 2019/0327825 A1     Oct. 24, 2019

(30) Foreign Application Priority Data
Apr. 24, 2018   (CN) .......................... 2018 1 0374876

(51) Int. Cl.
*H05K 1/02*   (2006.01)
*H05K 3/04*   (2006.01)
*G02F 1/1335*   (2006.01)

(52) U.S. Cl.
CPC ....... *H05K 1/028* (2013.01); *G02F 1/133603* (2013.01); *G02F 1/133605* (2013.01); *G02F 1/133606* (2013.01); *H05K 3/04* (2013.01); *G02F 2001/133612* (2013.01); *G02F 2001/133614* (2013.01); *H05K 2201/0154* (2013.01); *H05K 2201/10106* (2013.01)

(58) Field of Classification Search
CPC .... H05K 1/028; H05K 3/04; G02F 1/133603; G02F 1/133605; G02F 1/133608
See application file for complete search history.

(56) References Cited

U.S. PATENT DOCUMENTS 5,818,552 A * 10/1998 Sato .................. G02F 1/136209
349/43

FOREIGN PATENT DOCUMENTS

| CN | 201813610 U | 4/2011 |
|---|---|---|
| CN | 103155726 A | 6/2013 |

(Continued)

*Primary Examiner* — Thomas M Sember
(74) *Attorney, Agent, or Firm* — Leong C. Lei

(57) ABSTRACT

The present disclosure relates to a driving substrate, a manufacturing method, and a micro-LED array substrate light-emitting backlight module. The driving substrate includes a first metal layer, a first high-reflection layer, and a second metal layer stacked in a top-down sequence. The driving substrate, the manufacturing method, and the micro-LED array light emitting backlight module of the present disclosure solve the loss of reflectivity issue caused by the edge forbidden area of the electrode welding pad edge forbidden region. At the same time, the limited reflectivity of traditional coated high-reflective layers (such as white oil) may also be enhanced.

8 Claims, 4 Drawing Sheets

(56) References Cited

FOREIGN PATENT DOCUMENTS

| | | |
|---|---|---|
| CN | 103716991 A | 4/2014 |
| CN | 204285130 U | 4/2015 |
| CN | 104812166 A | 7/2015 |
| CN | 106782128 A | 5/2017 |
| CN | 206728371 U | 12/2017 |
| CN | 107819063 A | 3/2018 |
| CN | 107910322 A | 4/2018 |
| WO | WO2018008966 A1 | 1/2018 |

* cited by examiner

DRIVING SUBSTRATE, MANUFACTURING PROCESS, AND MICRO-LED ARRAY LIGHT-EMITTING BACKLIGHT MODULE

FIELD OF THE INVENTION

The present disclosure relates to a display field, and more particularly to a driving substrate, a manufacturing process, and a micro-LED array light-emitting backlight module.

BACKGROUND OF THE INVENTION

With the gradual emergence of wearable application devices, such as smart glasses, smart watches, etc., the display industry's demand for flexible display devices has been increased. Organic Light Emitting Display (OLED) has the attributes of self-illumination, no need of backlight, thin thickness, wide viewing angle, fast response, and so on. Such attributes bring in the advantages for flexible displays. With the competition of flexible OLEDs, traditional liquid crystal display technology has gradually adopted flexible substrates to make breakthroughs in the direction of flexibility and curved surfaces. It can be seen that the era of flexible and curved display is approaching.

FIG. 1 shows a schematic diagram of a border design of a conventional display screen. At present, the upper and left/right borders of the display screen are compressed to a very small border to meet the requirements of the full screen at this stage, but at the lower border, due to the need of data line fan-out and reserved chip (IC) bonding areas and flexible circuit board (FPC) bonding areas, further compression of the lower boundary has become a technical problem to be solved.

FIG. 2 shows a schematic diagram of another conventional display screen border design. In order to further compress the lower boundary, the current common solution is to use the COF (circuit on film) method, that is, only the FPC binding area is reserved in the lower border area, and the chip binding is directly placed on the FPC. The application of the COF technology can be implemented. The boundary is compressed to about 3 mm or even 2 mm, but there is still a large gap with respect to the left and right boundaries <1 mm. How to realize a full perimeter narrow border becomes the next key breakthrough direction of the display device.

At the same time, at present, the small-size display adopts the backlight module side-edge solution as shown in FIG. 3, in which the LED light bar is located at the lower boundary of the display, and the LED itself has a certain thickness. Since the LED is adopted as a point light source, it needs to diffuse the light uniformly by the astigmatism of the light guide plate to avoid the hotspot phenomenon in the near light, and requires a certain mixing distance. The compression of the mixed light distance is usually accompanied by the backlight efficiency. The drastic attenuation causes the backlight bottom frame of the existing center-size liquid crystal module to have a certain limit (about 2 mm). Therefore, even if the lower boundary of the liquid crystal display device cell is compressed to the same size as the left and right boundaries, it is still necessary to consider the lower boundary distance of the effective display area (AA area). When the lower boundary of the liquid crystal cell is compressed to a very narrow level, the lower border of the backlight will instead become the key constraint for achieving a full-screen (extremely narrow border).

The direct-type has the advantage of having a narrow frame and has been widely used in the large-size display field, but is facing the problem of increased thickness. Smaller mini-LEDs (micro-LEDs) can be arranged at a smaller pitch to achieve a smaller light mixing distance, providing greater possibilities for light, thin, and narrow light sources for small direct-lit backlights. The size of the mini-LED is usually less than 1 mm, and the spacing between adjacent LEDs is also less than 1 mm. FIG. 4 is a schematic view of a conventional micro-LED array emitting backlight module, which mainly includes a driving substrate 10, a micro-LED 20 array, a fluorescent film 30, a diffusion sheet 40, and a brightness enhancement film 50 from bottom to top. When the micro-LED array 20 forms a backlight module, it usually needs to match the diffusion sheet 40 and the brightness enhancement film 50 shown in FIG. 4, in which the incident light of the micro-LED 20 re-enters the interior of the backlight after being reflected by the brightness enhancement film 50. The spacing between adjacent micro-LEDs 20 is too small, and the occupied area of the micro-LED 20 does not provide effective reflection, and thus light recovery can only be performed through the limited reflection area between the adjacent micro-LEDs 20.

FIGS. 5A and 5B are schematic side and top views of a conventional micro-LED array light emitting backlight module. The driving substrate 10 is provided with a high reflection layer 60 in addition to the array of micro-LEDs 20, and the fluorescent film 30 covers the driving substrate 10. Due to the fact that the conventional micro-LED array light-emitting backlight module reflection area cannot be arranged with a conventional high-reverse structure, a high-reflection layer 60 such as a white oil (coating) is usually used instead, but the actual reflectance can only reach about 90%. The 99.9% reflectivity of the conventional reflective sheet has certain disadvantages in brightness efficiency. The high-reflective layer 60 such as white oil is usually prepared through spin coating and a photolithography process. In order to prevent the reflective layer from blocking the electrically conductive pad 21 of the micro-LED 20, the electrode 10 is usually driven on the drive substrate 10. A certain inhibited area is set around the disc and between adjacent micro-LED positive-negative (PN) electrode pads 21 to prevent the high reflective layer 60 from covering the electrode pads 21 due to process errors, although the inhibited area is single The area is small, but the overall area occupies a large proportion, resulting in the inevitable loss of light efficiency. Simply increasing the accuracy of etching can hardly overcome the above problems.

SUMMARY OF THE INVENTION

The present disclosure relates to a driving substrate, a manufacturing method, and a micro-LED array substrate light-emitting backlight module solving the loss of reflectivity issue caused by the edge forbidden area of the electrode welding pad edge forbidden region.

In one aspect, a driving substrate includes: a first metal layer, a first high-reflection layer, and a second metal layer stacked in a top-down sequence.

Wherein the driving substrate further comprises an insulation supporting layer arranged between the first metal layer and the first high-reflection layer.

Wherein the driving substrate further comprises a second high-reflection layer arranged above the second metal layer.

Wherein the first metal layer and the second metal layer respectively form a metal wire pattern.

Wherein the first high-reflection layer is made by high-reflection organic material or a high-reflection thin layer comprising multiple inorganic thin films.

Wherein the second high-reflection layer is a high high-reflection thin layer comprising high-reflection organic material.

Wherein the electrode welding pad of the driving substrate is exposed by the second high-reflection layer.

Wherein the insulation supporting layer is a polyimide (PI) layer.

In another aspect, a micro-LED array light-emitting backlight module includes: an above-mentioned driving substrate, a micro-LED array, a fluorescent film, a diffusion sheet, and a brightness enhancing film being stacked sequentially from bottom to top.

In another aspect, a manufacturing method of driving substrates includes: forming a first metal layer; forming an insulation supporting layer; forming a first high-reflection layer; forming a second high-reflection layer; respectively etching the first metal layer and the second metal layer to form metal wire patterns; forming a second high-reflection layer; and removing the second high-reflection layer on the surface of the second electrode pad.

In view of the above, the driving substrate, the manufacturing method, and the micro-LED array light emitting backlight module of the present disclosure solve the loss of reflectivity issue caused by the edge forbidden area of the electrode welding pad edge forbidden region. At the same time, the limited reflectivity of traditional coated high-reflective layers (such as white oil) may also be enhanced.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

The driving substrate may be used in micro-LED array light-emitting backlight module. The driving substrate includes: a first metal layer, a first high-reflection layer, and a second metal layer stacked in a top-down sequence. The driving substrate may further includes an insulation supporting layer arranged between the first metal layer and the first high-reflection layer. The driving substrate may include at least a three-layer structure, having the first metal layer, the first high-reflection layer, and a second metal layer. Alternatively, the driving substrate may include at least a four-layer structure, having the first metal layer, the insulation supporting layer, the first high-reflection layer, and the second metal layer.

In one embodiment, the driving substrate may further include a second high-reflection layer arranged on the second metal layer.

Figure 6:
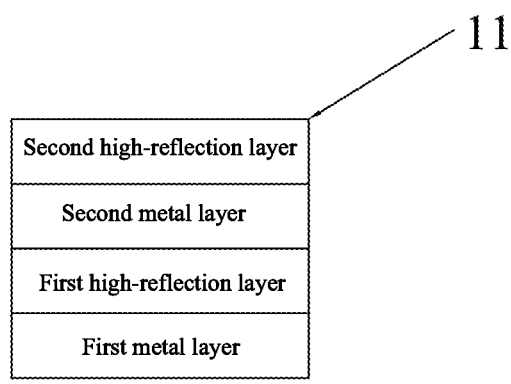
FIG. 6 is a schematic view of the driving substrate in accordance with one embodiment of the present disclosure.

Referring to FIG. 6, the driving substrate 11 may include a first metal layer, a first high-reflection layer, a second metal layer, and a second high-reflection layer stacked in sequence along a top-down direction. The driving substrate may be of a four-layer structure having at least a second high-reflection layer.

Figure 7:
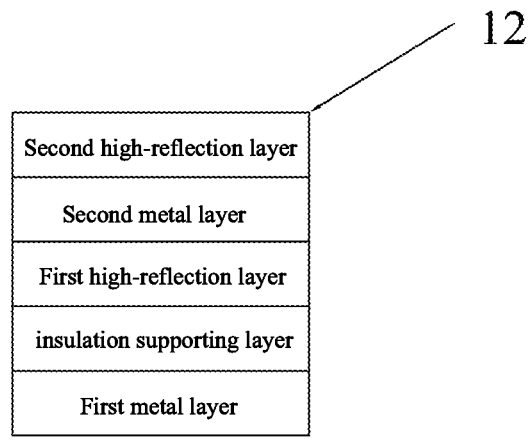
FIG. 7 is a schematic view of the driving substrate in accordance with another embodiment of the present disclosure.

FIG. 7 is a schematic view of the driving substrate in accordance with another embodiment of the present disclosure. The driving substrate 12 may include a first metal layer, an insulation supporting layer, a first high-reflection layer, a second metal layer, and a second high-reflection layer stacked in sequence along a top-down direction. The driving substrate may be of a five-layer structure having at least a second high-reflection layer.

In an example, the insulation supporting layer may specifically be a PI (polyimide) layer. PI is only an example of an electrically insulating material, and may also be a common PCB substrate. The driving substrate may specifically be an FPC substrate. The FPC substrate is only a common form of the driving substrate of the present disclosure, and may also be replaced with other forms such as a PCB. The first metal layer and the second metal layer respectively form a metal wire pattern to realize a function of a driving circuit. The first metal layer and/or the second metal layer may be copper, or may be replaced by alternative electrical conduction metals such as aluminum and silver. The first high-reflection layer may be a conventional high-reflection organic material (collectively referred to as white oil, reflectance~90%) or a high-reflection thin layer composed of multiple layers of inorganic thin film (reflectance maximum close to 100%). The second high-reflection layer may be a conventional high-reflection organic material (collectively referred to as white oil), which is convenient for the conventional etching process.

In the following, the FPC substrate is used to represent the driving substrate, the PI layer represents the insulation supporting layer, copper represents the first metal layer and the second metal layer, and the high-reflection layer 1 and the high-reflection layer 2 represent the first high-reflection layer and the second high-reflection layer, respectively.

In one embodiment, the FPC substrate is formed by adding a high-reflection layer 1 to a conventional FPC stack structure, i.e., a four-layer structure including a copper, and a PI layer. Alternatively, the FPC substrate is formed by replacing the PI layer to form a three-layer structure including copper, the high reflection Layer 1, and copper. The addition of the high-reflection layer 1 ensures the high reflection characteristics of the FPC substrate. At the same time, when the upper copper structure is etched to form the upper metal wire layer, the non-copper wire areas are all high-reflection layer 1 when used in a micro-LED array light-emitting backlight module. Such configuration may increase the reflectivity.

In an example, a conventional coating process may be applied to the cooper wire surface to obtain a high-reflective layer 2. The obtained FPC substrate includes a four-layer structure having at least a copper, the high-reflection layer 1, the copper, and the high-reflection layer 2. Alternatively, the FPC substrate may be a five-layer structure having at least at least a copper, the PI layer, the high-reflection layer 1, the copper, and the high-reflection layer 2. In addition, the high-reflection layer 2 may be exposed from the FPC substrate such that the LED array substrate may electrically connect to the electrode welding pad. As such, the entire FPC substrate is only the non-high-reflection area at the electrode welding pad effectively guarantying the reflection efficiency of the micro-LED array light-emitting backlight module when the FPC substrate is used for a micro-LED array light-emitting backlight module.

Figure 1:
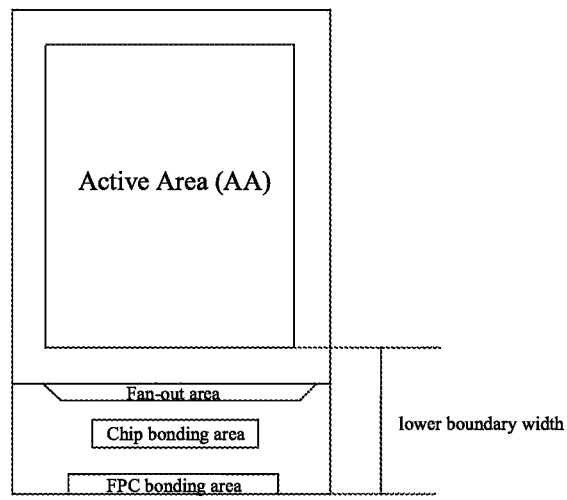
FIG. 1 is a schematic view showing the border of one conventional display panel.
Figure 2:
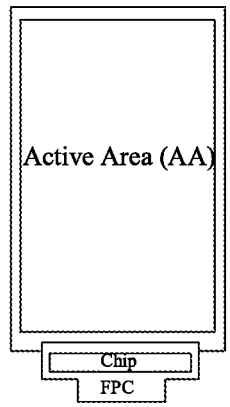
FIG. 2 is another schematic view showing the border of one conventional display panel.
Figure 3:
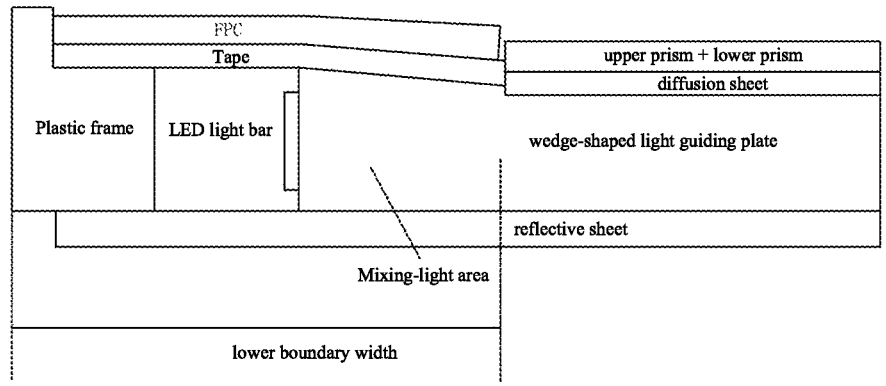
FIG. 3 is a schematic view showing the conventional edge-type backlight module.
Figure 4:
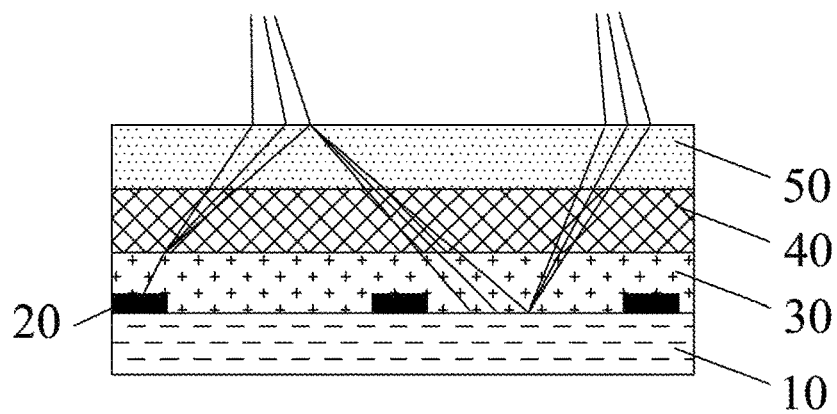
FIG. 4 is a schematic view showing the conventional micro-LED array light-emitting backlight module.
Figure 5A:
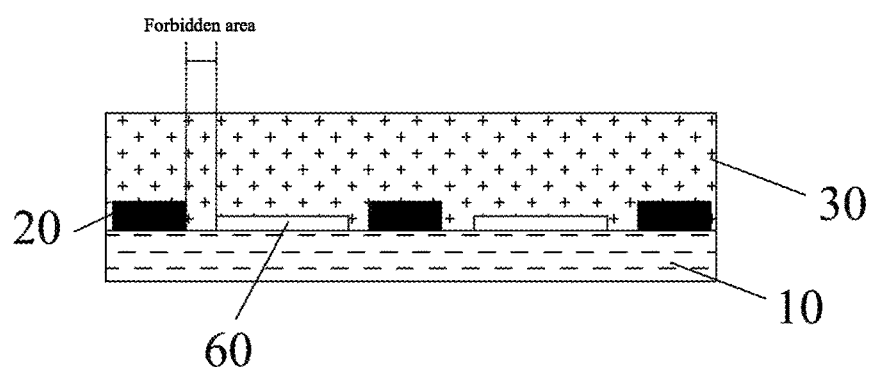
FIGS. 5A and 5B are side view and top view showing the conventional micro-LED array light-emitting backlight module.
Figure 5B:
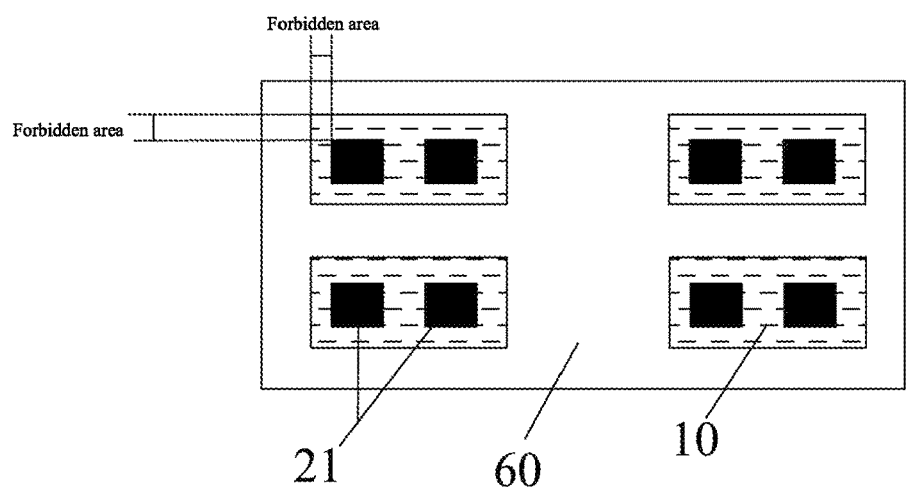

In an embodiment, an efficient micro-LED array light-emitting backlight module, mainly includes: a driving substrate, a micro-LED array, a fluorescent film, a diffusion sheet, and a brightness enhancing film being stacked sequentially from bottom to top. The driving substrate may be the aforementioned driving substrate, such as the aforementioned FPC substrate. The structure of the micro-LED array light emitting backlight module operating as a light source may be referenced in FIG. 4, and the driving substrate can be used instead of the driving substrate 10 in FIG. 4.

The micro-LEDs are arranged in an array on the driving substrate. The size of the micro-LED may be 100-1000 µm, and the spacing between adjacent micro-LEDs may be 100-2000 µm. The micro-LED array can use an array of blue LEDs. The fluorescent film covers the surface of the micro-LED array and the driving substrate with the entire surface covering, and the diffuser, brightness enhancement film, and the like are the common structures of the backlight, which are not described here.

Figure 8:
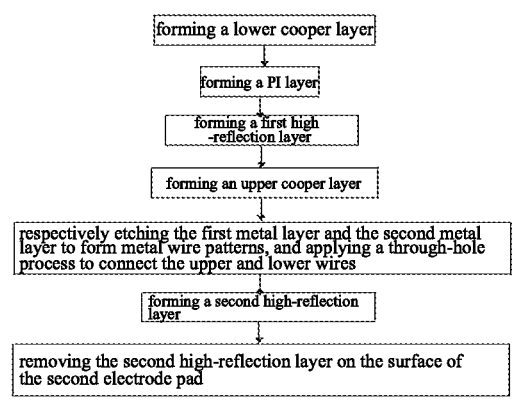
FIG. 8 is a flowchart illustrating the manufacturing method of the driving substrate in accordance with one embodiment of the present disclosure.

FIG. 8 is a flowchart illustrating the manufacturing method of the driving substrate in accordance with one embodiment of the present disclosure. The manufacturing method includes:

forming a first metal layer; specifically, the first metal layer is a lower cooper layer;

forming an insulation supporting layer; specifically, the insulation supporting layer is a PI layer;

forming a first high-reflection layer; specifically, the first high-reflection layer is the high-reflection layer 1;

forming a second high-reflection layer; specifically, the second high-reflection layer is the upper cooper layer;

respectively etching the first metal layer and the second metal layer to form metal wire patterns; specifically, respectively etching the upper and lower copper layer to form an upper wire layer and a lower wire layer to form electrical wires; further, applying a through-hole process to connect the upper and lower wires;

forming a second high-reflection layer; specifically, forming a high-reflection layer 2 on a surface of the second metal layer;

removing the second high-reflection layer on the surface of the second electrode pad; specifically, applying a photolithography etching process to remove the second high-reflection layer on the surface of the second electrode pad while only the second high-reflection layer on the upper cooper layer may be preserved. As such, only the electrode welding pad is the non-high-reflection area, which effectively ensures the reflection efficiency when the prepared driving substrate is used for the micro-LED array light emitting backlight module.

In view of the above, the driving substrate, the manufacturing method, and the micro-LED array light emitting backlight module of the present disclosure solve the loss of reflectivity issue caused by the edge forbidden area of the electrode welding pad edge forbidden region. At the same time, the limited reflectivity of traditional coated high-reflective layers (such as white oil) may also be enhanced.

Above are embodiments of the present invention, which does not limit the scope of the present invention. Any equivalent amendments within the spirit and principles of the embodiment described above should be covered by the protected scope of the invention.

What is claimed is:

1. A driving substrate, comprising:
   a first metal layer, a first high-reflection layer, and a second metal layer stacked in a top-down sequence;
   wherein the driving substrate further comprises a second high-reflection layer arranged above the second metal layer;
   wherein the electrode welding pad of the driving substrate is exposed by the second high-reflection layer.

2. The driving substrate as claimed in claim 1, wherein the driving substrate further comprises an insulation supporting layer arranged between the first metal layer and the first high-reflection layer.

3. The driving substrate as claimed in claim 2, wherein the insulation supporting layer is a polyimide (PI) layer.

4. The driving substrate as claimed in claim 1, wherein the first metal layer and the second metal layer respectively form a metal wire pattern.

5. The driving substrate as claimed in claim 1, wherein the first high-reflection layer is made by high-reflection organic material or a high-reflection thin layer comprising multiple inorganic thin films.

6. The driving substrate as claimed in claim 1, wherein the second high-reflection layer is a high high-reflection thin layer comprising high-reflection organic material.

7. A micro-LED array light-emitting backlight module, comprising:
   a driving substrate, a micro-LED array, a fluorescent film, a diffusion sheet, and a brightness enhancing film being stacked sequentially from bottom to top, wherein the driving substrate is the driving substrate as claimed in claim 1.

8. A manufacturing method of driving substrates, comprising:
   forming a first metal layer;
   forming an insulation supporting layer;
   forming a first high-reflection layer;
   forming a second high-reflection layer;
   respectively etching the first metal layer and the second metal layer to form metal wire patterns;
   forming a second high-reflection layer; and
   removing the second high-reflection layer on a surface of a second electrode pad.

* * * * *